United States Patent
Tang (10) Patent No.: US 11,937,377 B2
(45) Date of Patent: Mar. 19, 2024

(54) CIRCUIT BOARD PREPARATION METHOD

(71) Applicant: SHENNAN CIRCUITS CO., LTD., Shenzhen (CN)

(72) Inventor: Changsheng Tang, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 407 days.

(21) Appl. No.: 17/503,360

(22) Filed: Oct. 18, 2021

(65) Prior Publication Data
US 2022/0386472 A1 Dec. 1, 2022

Related U.S. Application Data

(63) Continuation of application No. PCT/CN2021/096151, filed on May 26, 2021.

(51) Int. Cl.
*H05K 3/00* (2006.01)
*H01L 21/768* (2006.01)
(Continued)

(52) U.S. Cl.
CPC ..... *H05K 3/0035* (2013.01); *H01L 21/76802* (2013.01); *H01L 21/76832* (2013.01);
(Continued)

(58) Field of Classification Search
CPC ......... H01L 21/76802; H01L 21/76832; H01L 23/5226; H05K 3/0035; H05K 3/0038;
(Continued)

(56) References Cited

U.S. PATENT DOCUMENTS

2001/0042637 A1* 11/2001 Hirose ................. H05K 3/4623
174/255
2004/0227227 A1* 11/2004 Imanaka ........... H01L 23/49822
257/692
(Continued)

FOREIGN PATENT DOCUMENTS

CN 101917818 A 9/2006
CN 207184919 U 12/2010
(Continued)

OTHER PUBLICATIONS

International Search Report,International application No. PCT/CN2021/096151,dated Feb. 24, 2022(10 pages).

*Primary Examiner* — Alonzo Chambliss (57) ABSTRACT

The main technical problem solved by the present disclosure is to provide a circuit board preparation method. The method includes: obtaining a to-be-processed plate comprising an insulating layer, a first copper layer, a second copper layer opposite to the first copper layer, a blind metalized hole, and a first tab facing the blind metalized hole; obtaining a white insulating material; laminating the white insulating material to a surface of the insulating layer, a surface of the first copper layer, a surface of the first tab, and a surface of the second copper layer to form a first white insulating medium layer and a second white insulating medium layer opposite to the first while insulating medium layer; and performing surface polishing for the first white insulating medium layer and grinding the first white insulating medium layer until the first tab is exposed to form a first white reflective layer.

20 Claims, 5 Drawing Sheets

(51) Int. Cl.
  *H01L 23/522* (2006.01)
  *H05K 1/11* (2006.01)
  *H05K 3/40* (2006.01)
  *H05K 3/42* (2006.01)
  *H05K 3/46* (2006.01)

(52) U.S. Cl.
  CPC .......... *H01L 23/5226* (2013.01); *H05K 1/115* (2013.01); *H05K 3/0038* (2013.01); *H05K 3/4069* (2013.01); *H05K 3/427* (2013.01); *H05K 3/429* (2013.01); *H05K 3/4602* (2013.01); *H05K 3/4623* (2013.01); *H05K 3/4652* (2013.01); *H05K 3/4655* (2013.01); *H05K 2201/09509* (2013.01); *H05K 2201/096* (2013.01); *H05K 2201/09827* (2013.01)

(58) Field of Classification Search
  CPC .... H05K 3/427; H05K 3/4655; H05K 3/4602; H05K 1/115; H05K 2201/09509; H05K 2201/09827; H05K 2201/096; H05K 3/4652; H05K 3/429; H05K 3/4623; H05K 3/4069
  See application file for complete search history.

(56) References Cited

U.S. PATENT DOCUMENTS

| | | | |
|---|---|---|---|
| 2006/0202331 | A1 | 9/2006 | Hu et al. |
| 2006/0243478 | A1* | 11/2006 | Inagaki ............. H01L 23/49827 257/E23.079 |
| 2009/0016671 | A1* | 1/2009 | Asai ......................... G02B 6/43 174/262 |
| 2014/0041923 | A1* | 2/2014 | Hisada .................. H05K 1/115 174/266 |

FOREIGN PATENT DOCUMENTS

| | | |
|---|---|---|
| CN | 102468186 A | 5/2012 |
| CN | 107801310 A | 3/2018 |
| CN | 110536564 A | 12/2019 |

* cited by examiner

CIRCUIT BOARD PREPARATION METHOD

CROSS REFERENCE

The present application is a continuation-application of International (PCT) Patent Application No. PCT/CN2021/096151, filed on May 26, 2021, the entire contents of which are hereby incorporated by reference.

TECHNICAL FIELD

The present disclosure relates to the field of circuit board processing technologies, and in particular to a circuit board preparation method.

BACKGROUND

Printed circuit board is an extremely important material in electronic products, and with the development of 5G technology, the demand for printed circuit boards is increasing.

In the existing technology, printed circuit boards used for LED backlight or Mini LED backlight have requirements for reflectivity. To meet the high reflectivity requirements, white ink layer or white solder resist dry film is usually used as a reflective layer.

However, due to the high reflectivity of the white ink or white solder resist dry film, there are problems such as high energy loss and low exposure efficiency in an exposure process. Moreover, the ink layer also has side corrosion and peeling problems in the process, resulting in lower reflectivity and uneven reflection.

SUMMARY OF THE DISCLOSURE

The main technical problem solved by the present disclosure is to provide a circuit board preparation method. The present disclosure forms a white insulating layer by covering the conductor layer with white insulating material and laminating the white insulating material; and then polishes the white insulating layer to form a white reflective layer, which can solve problems of low exposure efficiency, reduced reflectivity and uneven reflection caused by using ink or solder resist dry film.

To solve the above technical problems, a technical solution adopted by the present disclosure is to provide a circuit board preparation method, the method including: obtaining a to-be-processed plate; wherein the to-be-processed plate comprises an insulating layer, a first copper layer arranged on a first surface of the insulating layer, a second copper layer arranged on a second surface of the insulating layer and opposite to the first copper layer, a blind metalized hole, and a first tab arranged on the first surface and facing the blind metalized hole; obtaining a white insulating material; laminating the white insulating material to a surface of the insulating layer, a surface of the first copper layer, a surface of the first tab, and a surface of the second copper layer to form a first white insulating medium layer on a surface of the to-be-processed plate and a second white insulating medium layer on another surface of the to-be-processed plate opposite to the first while insulating medium layer; and performing surface polishing for the first white insulating medium layer and grinding the first white insulating medium layer until the first tab is exposed to form a first white reflective layer.

In some embodiments, the white insulating material comprises one or more of: epoxy resin type, phenolic resin type, polyimide type, BT type, ABF type, and ceramic-based type.

In some embodiments, the performing surface polishing for the first white insulating medium layer and grinding the first white insulating medium layer until the first tab is exposed to form the first white reflective layer comprise: performing surface polishing for the first white insulating medium layer by one or more of: spatulaing, plate brushing, laser ablation, ion cutting, ion polishing, and waterjetting; and grinding the first white insulating medium layer until the first tab is exposed to form the first white reflective layer.

In some embodiments, the first tab is a welded position and the first white reflective layer covers all of the first surface of the insulating layer except for the welded position.

In some embodiments, after the performing surface polishing for the first white insulating medium layer and grinding the first white insulating medium layer until the first tab is exposed to form the first white reflective layer, the method further comprises: etching the first tab to define a groove with a set depth at a set position on the first tab; and soldering to a component and/or a chip through the groove with the set depth.

In some embodiments, the etching the first tab to define the groove with the set depth at the set position on the first tab comprises: etching the first tab with a chemical copper reduction method; or etching the first tab with a laser ablation method.

In some embodiments, the chemical copper reduction method comprises micro-etching.

In some embodiments, the laser ablation method comprises ablation using UV laser drilling and/or ablation using $CO_2$ laser drilling.

In some embodiments, before the obtaining the to-be-processed plate, the method further comprises: obtaining a copper-clad plate; defining at least one hole at a set position of the copper-clad plate by drilling, wherein each of the at least one hole comprises a micro-blind hole and/or a through hole; and hole-treating the at least one hole to obtain a to-be-treated plate; applying a first photosensitive film on a surface of a first copper layer and a surface of a second copper layer of the to-be-treated plate, respectively; leaving a first predetermined position on the first photosensitive film exposed; performing hole-filling plating for the first predetermined position of the to-be-treated plate to form the first tab at the first predetermined position; and removing the first photosensitive film from the to-be-treated plate; and attaching a second photosensitive film to a second predetermined position of the to-be-treated plate, and etching the to-be-treated plate to form a conductive line on the to-be-treated plate; removing the second photosensitive film on the to-be-treated plate to obtain the to-be-processed plate.

To solve the above technical problems, another technical solution adopted by the present disclosure is to provide a circuit board prepared by the above method.

In some embodiments, after defining the at least one hole at the set position of the copper-clad plate by drilling, the method further comprises: decontaminating the at least one hole at the copper-clad plate to remove drilling stains.

In some embodiments, the hole-treating the at least one hole to obtain the to-be-treated plate comprises: a copper deposition treatment, a black hole treatment or a black shadow treatment.

In some embodiments, the second predetermined position is a position at which a conductive line is not planned to be arranged.

In some embodiments, the first photosensitive film is a photosensitive anti-plating film, and the second photosensitive film is a photosensitive anti-etching film.

In some embodiments, a surface of the white insulating material is arranged with a release film configured to prevent a direct contact between the white insulating material and a high temperature press.

To solve the above technical problems, another technical solution adopted by the present disclosure is to provide a circuit board preparation method, comprising: providing a copper-clad plate, wherein the copper-clad plate comprises an insulating layer, a first copper layer arranged on a first surface of the insulating layer, and a second copper layer arranged on a second surface of the insulating layer and opposite to the first copper layer; defining at least one hole at a set position of the copper-clad plate, wherein each of the at least one hole comprises a micro-blind hole and/or a through hole, and the at least one hole penetrates the insulating layer; and hole-treating the at least one hole; applying a first photosensitive film on a surface of the first copper layer and a surface of the second copper layer, respectively; leaving a first predetermined position on the first photosensitive film exposed; performing hole-filling plating for the first predetermined position to form a first tab at the first predetermined position; and removing the first photosensitive film from the copper-clad plate; attaching a second photosensitive film to a second predetermined position of the copper-clad plate, and etching the copper-clad plate to form a conductive line on the to-be-treated plate; removing the second photosensitive film on the to-be-treated plate to obtain a to-be-processed plate; wherein the second predetermined position is a position at which a conductive line is not planned to be arranged; wherein the to-be-processed plate comprises an insulating layer, a first copper layer arranged on a first surface of the insulating layer, a second copper layer arranged on a second surface of the insulating layer and opposite to the first copper layer, a blind metalized hole, and a first tab arranged on the first surface and facing the blind metalized hole; obtaining a white insulating material; laminating the white insulating material to a surface of the insulating layer, a surface of the first copper layer, a surface of the first tab, and a surface of the second copper layer to form a first white insulating medium layer on a surface of the to-be-processed plate and a second white insulating medium layer on another surface of the to-be-processed plate opposite to the first while insulating medium layer; and performing surface polishing for the first white insulating medium layer and grinding the first white insulating medium layer until the first tab is exposed to form a first white reflective layer.

To solve the above technical problems, another technical solution adopted by the present disclosure is to provide a circuit board preparation method, comprising: obtaining a to-be-processed plate; wherein the to-be-processed plate comprises an insulating layer, a first copper layer arranged on a first surface of the insulating layer, a second copper layer arranged on a second surface of the insulating layer and opposite to the first copper layer, a blind metalized hole, and a first tab arranged on the first surface and facing the blind metalized hole; obtaining a white insulating material; laminating the white insulating material to a surface of the insulating layer, a surface of the first copper layer, a surface of the first tab, and a surface of the second copper layer to form a first white insulating medium layer on a surface of the to-be-processed plate and a second white insulating medium layer on another surface of the to-be-processed plate opposite to the first while insulating medium layer; performing surface polishing for the first white insulating medium layer and grinding the first white insulating medium layer until the first tab is exposed to form a first white reflective layer; etching the first tab to define a groove with a set depth at a set position on the first tab; and soldering to a component and/or a chip through the groove with the set depth.

Beneficial effects of the present disclosure include: in contrast to the prior art, the present disclosure forms a white insulating layer by covering the conductor layer with white insulating material and laminating the white insulating material; and then polishes the white insulating layer to form a white reflective layer. The process of forming the reflective layer does not use ink or solder resist dry film, so there is no need to perform a series of steps such as exposure and development, which not only avoids the energy loss caused by the exposure process, but also streamlines the process and improves production efficiency. Further, the lamination and polishing process also prevents the white reflective layer from peeling off and makes the surface of the white reflective layer smoother to further reflect the light, thus providing the backlight with the advantages of high reflectivity and uniformity of reflection, and significantly improving the reflectivity of the printed circuit board surface.

BRIEF DESCRIPTION OF THE DRAWINGS

In order to more clearly describe the technical solutions in the embodiments of the present disclosure, the following will briefly introduce the drawings required in the description of the embodiments. Obviously, the drawings in the following description are only some embodiments of the present disclosure. For those skilled in the art, other drawings can be obtained based on these drawings without creative work.

DETAILED DESCRIPTION

The following will be a clear and complete description of the technical solutions in the embodiments of the present disclosure in conjunction with the accompanying drawings in the embodiments of the present disclosure. Obviously, the described embodiments are only a part of the embodiments of the present disclosure, and not all of them. Based on the embodiments in the present disclosure, all other embodiments obtained by those skilled in the art without making creative labor fall within the scope of the present disclosure.

The terms used in the embodiments of the present disclosure are used solely for the purpose of describing particular embodiments and are not intended to limit the present disclosure. The singular forms of "a", "said", and "the" as used in the embodiments of the present disclosure and the appended claims are also intended to include plural form, unless clearly indicated. Terms "a plurality" generally include at least two, but does not exclude the inclusion of at least one.

It should be understood that the term "and/or" as used herein is simply a description of the association of related objects, indicating that three relationships can exist, e.g., A and/or B, which can mean: A alone, both A and B, and B alone. In addition, the character "/" in this document generally indicates that the before and after associated objects are in an "or" relationship.

It is to be understood that the term "include", "comprise", or any other variant used herein is intended to cover non-exclusive inclusion, such that a process, method, article, or apparatus comprising a set of elements includes not only those elements, but also other elements not explicitly listed, or other elements that are not explicitly listed, or that are inherent to such process, method, article, or apparatus. Without further limitation, elements defined by the statement "including" do not preclude the existence of additional identical elements in the process, method, article, or apparatus that include the elements.

Printed circuit board is an extremely important material in electronic products, and with the development of 5G technology, the demand for printed circuit boards is increasing.

In the existing technology, printed circuit boards used for LED backlight or Mini LED backlight have requirements for reflectivity. To meet the high reflectivity requirements, white ink layer or white solder resist dry film is usually used as a reflective layer.

However, due to the high reflectivity of the white ink or white solder resist dry film, there are problems such as high energy loss and low exposure efficiency in an exposure process. Moreover, the ink layer also has side corrosion and peeling problems in the process, resulting in lower reflectivity and uneven reflection.

Based on the above, the present disclosure provides a circuit board preparation method and a circuit board. By covering a conductor layer with a white insulating material, laminating the white insulating material to form a white insulating layer, and then polishing the white insulating layer to form a white reflective layer, the problems of low exposure efficiency, lower reflectivity, and uneven reflection caused by the ink or solder resist dry film may be solved.

The following is a detailed description of the present disclosure in conjunction with the accompanying drawings and implementation methods.

Figure 1:
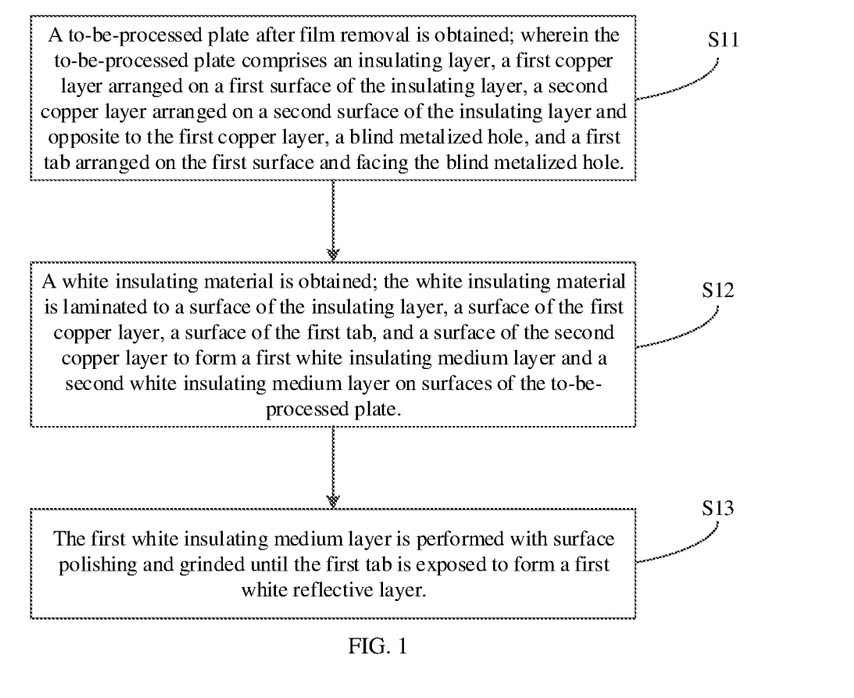
FIG. 1 is a flowchart of a circuit board preparation method according to an embodiment of the present disclosure.

FIG. 1 is a flowchart of a circuit board preparation method according to an embodiment of the present disclosure. The method may include operations at blocks as follows.

At block S11: A to-be-processed plate after film removal is obtained; wherein the to-be-processed plate comprises an insulating layer, a first copper layer arranged on a first surface of the insulating layer, a second copper layer arranged on a second surface of the insulating layer and opposite to the first copper layer, a blind metalized hole, and a first tab arranged on the first surface and facing the blind metalized hole.

In the embodiment, the to-be-processed plate is a circuit board that has undergone previous processes with films removed.

Figure 2:
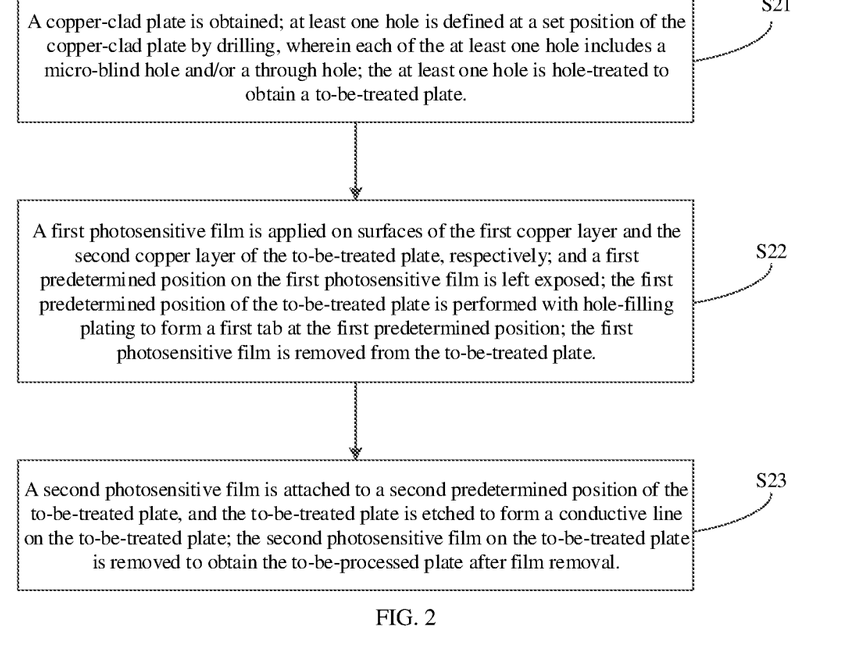
FIG. 2 is a flowchart of the obtaining the to-be-processed plate in S11 according to an embodiment of the present disclosure.

FIG. 2 is a flowchart of the obtaining the to-be-processed plate in S11 according to an embodiment of the present disclosure. The method may include operations at blocks as follows.

At block S21: A copper-clad plate is obtained; at least one hole is defined at a set position of the copper-clad plate by drilling, wherein each of the at least one hole includes a micro-blind hole and/or a through hole; the at least one hole is hole-treated to obtain a to-be-treated plate.

The copper-clad plate includes an insulating layer (medium layer) and a copper layer. The insulating layer may be covered with the copper layer on one side or both sides.

In the embodiment, the insulating layer of the copper-clad plate covered with copper layers on both sides will be taken as an example, and double-sided additional lamination for the copper-clad plate will be described. The method of single-sided lamination for the copper-clad plate is similar to the method of double-sided lamination, which may be referred to the circuit board preparation method in the embodiment.

In the embodiment, the copper-clad plate may be drilled by mechanical drilling to define the at least one hole at the set position of the copper-clad plate. In other embodiments, the copper-clad plate may also be drilled by laser drilling to define the at least one hole at the copper-clad plate, which is not limited herein.

In the embodiment, the copper-clad plate includes a first copper layer and a second copper layer, and the drilled at least one hole is required to penetrate the insulating layer of the copper-clad plate to enable the first copper layer and the second copper layer above and below the insulating layer to be conductively interconnected in subsequent preparation processes.

Each of the at least one hole includes a micro-blind hole and/or a through hole. The micro-blind hole is a hole that connects two adjacent layers without penetration; the through hole is a hole that penetrates two or more layers and penetrates a top and a bottom. In S21, the micro-blind hole and/or through hole on the copper-clad plate both penetrate the insulating layer of the copper-clad plate. The micro-blind hole penetrates the copper layer on a side of the copper-clad plate and the insulating layer in the middle without penetrating the copper layer on the other side of the copper-clad plate. The through hole penetrates the entire copper-clad plate and is thus configured to conduct copper on both sides of the insulating layer of the copper-clad plate.

In the embodiment, the copper-clad plate is drilled to define the at least one hole at the copper-clad plate. The number of the at least one hole may be 3, 5 or 10, and the specific number thereof may be set according to conduction requirements of the printed circuit board, which is not limited herein.

Specifically, when the copper-clad plate is laser-drilled or mechanically drilled, and the at least one hole is defined at the set position of the copper-clad plate, each hole at the copper-clad plate may have residual resin slag, copper slag and other drilling stains therein. Therefore, the at least one hole at the copper-clad plate may be required to be decontaminated to remove the drilling stains, thereby cleaning the at least one hole.

Further, the at least one hole at the copper-clad plate is hole-treated to obtain the to-be-treated plate. The hole treatment includes a copper deposition treatment, a black hole treatment or a black shadow treatment. The at least one hole at the copper-clad plate is hole-treated to cover a hole wall or/and a bottom of the hole with a layer of conductive material to facilitate subsequent hole-filling plating thereof. In this regard, the black hole treatment means that a fine graphite or carbon black coating (black hole solution) is dipped on the hole wall or/and bottom of the hole to form a conductive layer; the black shadow treatment means that a black shadow solution of which composition contains a unique additive and a conductive gel-like substance is dipped on the hole wall or/and bottom of the hole to form a conductive layer on the hole wall or/and bottom of the hole; and the copper deposition treatment means chemically depositing on the hole wall or/and bottom of the hole a thin layer of chemical copper, such that the conductive layer may be configured as a substrate for plating.

Figure 3A:
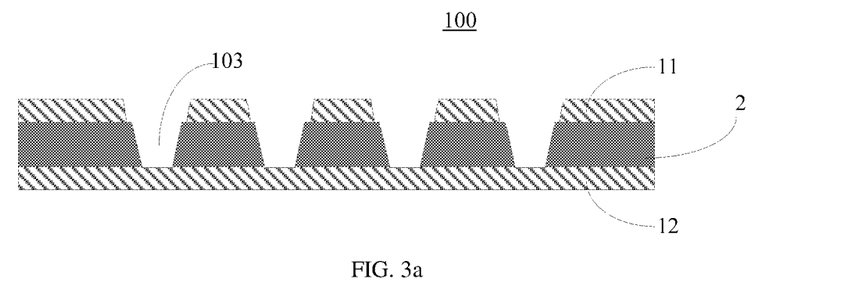
FIG. 3a is a structural schematic view of the to-be-treated plate after being porosity treated in S21 according to an embodiment of the present disclosure.

FIG. 3a is a structural schematic view of the to-be-treated plate after being porosity treated in S21 according to an embodiment of the present disclosure.

As shown in FIG. 3a, the to-be-treated plate 100 includes a first copper layer 11, an insulating layer 2 and a second copper layer 12. The first copper layer 11, the insulating layer 2 and the second copper layer 12 are laminated in sequence and are arranged in close proximity. The to-be-treated plate 10 defines a blind-micro hole 103 penetrating the first copper layer 11 and the insulating layer 2, and the bottom of the blind-micro hole 103 is formed by at least a part of the second copper layer 12.

In the embodiment, only the structure of the blind-micro hole 103 is shown without limiting the number and structure of the at least one hole at the to-be-treated plate in an actual production process.

At block S22: A first photosensitive film is applied on surfaces of the first copper layer and the second copper layer of the to-be-treated plate, respectively; and a first predetermined position on the first photosensitive film is left exposed; the first predetermined position of the to-be-treated plate is performed with hole-filling plating to form a first tab at the first predetermined position; the first photosensitive film is removed from the to-be-treated plate.

In the embodiment, the first predetermined position includes the at least one hole as well and a peripheral position of an orifice of the at least one hole. In other embodiments, the first predetermined position may also include only the position of the at least one hole, which is not limited herein.

In the embodiment, the first photosensitive film may be a photosensitive anti-plating film or other photosensitive film.

In particular, the photosensitive anti-plating film is a polymeric compound that, when irradiated by a specific light source, can produce a polymerization reaction (a reaction process of synthesizing a polymer from a monomer) to form a stable substance that adheres to a surface of a plate, thus achieving the function of blocking plating.

Figure 3B:
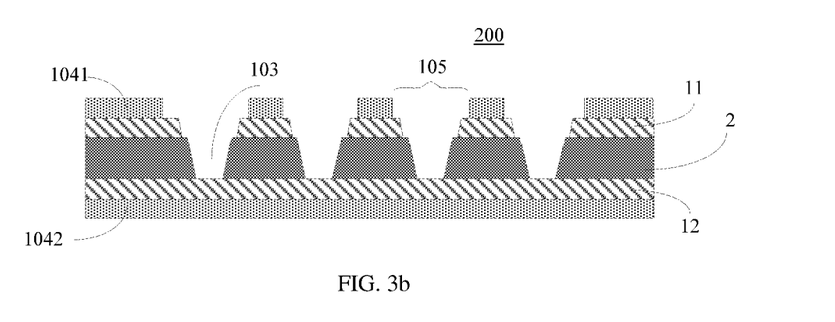
FIG. 3b is a structural schematic view of the to-be-treated after being attached with the first photosensitive film in S22 according to an embodiment of the present disclosure.

FIG. 3b is a structural schematic view of the to-be-treated plate after being attached with the first photosensitive film in S22 according to an embodiment of the present disclosure.

As shown in FIG. 3b, the to-be-treated plate 200 includes a first photosensitive film 1041 attached to a surface of a first copper layer 11, the first copper layer 11, an insulating layer 2, a second copper layer 12, and a first photosensitive film 1042 attached to a surface of the second copper layer 12. The first photosensitive film 1041 attached to the surface of the first copper layer 11, the first copper layer 11, the insulating layer 2, the second copper layer 12, and the first photosensitive film 1042 attached to the surface of the second copper layer 12 are laminated in sequence and are arranged in close proximity. The to-be-treated plate 200 defines the at least one micro-blind hole. The first photosensitive film 1041 attached to the surface of the first copper layer 11 does not overlap with the at least one micro-blind hole 103. The first photosensitive film 1041 attached to the surface of the first copper layer 11 does not cover a peripheral position of an orifice of the at least one micro-blind hole 103 on the first copper layer 11, so as to leave the first predetermined position 105 exposed. The first predetermined position 105 refers to all holes on the to-be-treated plate 200 and peripheral positions of the holes.

The peripheral position of the orifice of the micro-blind hole 103 is a position along a circle around an edge line of the orifice. The specific range of the periphery of the aperture may be set based on requirements of a top area of the first tab in actual production, and is not limited here.

Further, the first predetermined position 105 of the to-be-treated plate 200 is plated with hole filling to metallize the at least one micro-blind hole 103, and the copper thickness of the first predetermined position 105 is increased in a directional manner to form the first tab (not shown yet) at the first predetermined position 105. The first tab is connected to a corresponding metallized hole to form a conductive copper column (not marked) in the to-be-treated plate 200. After the hole-filling plating is completed, the first photosensitive film 1041 attached to the surface of the first copper layer 11 and the first photo-sensitive film 1042 attached to the surface of the second copper layer 12 are removed from the to-be-treated plate 200.

In the embodiment, the drilling and hole-filling plating are only for the to-be-treated plate, that is, a single-layer copper-clad plate, and not the entire multilayer circuit board. Therefore, the drilling process and hole-filling plating process in this step do not have the problems of the thickness of the dielectric layer being too thick to affect the blind hole pattern, difficulty of plating to fill the blind holes, alignment between layers, difficulty of filling copper into through holes, and the selection of multiple designated layers to be connected. Moreover, since the first tab of this step is formed by thickening the copper layer for the hole and the peripheral position of the orifice, the surface area of the first tab is larger than the area of the orifice, such that the first tab of the embodiment has good conduction performance and high heat dissipation performance.

Figure 3C:
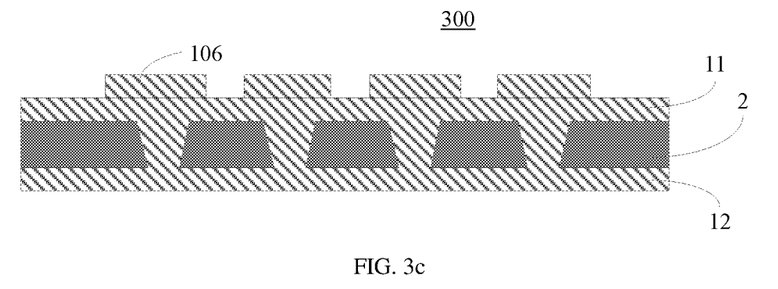
FIG. 3c is a structural schematic view of the to-be-treated plate after the first photosensitive film is removed in S22 according to an embodiment of the present disclosure.

FIG. 3c is a structural schematic view of the to-be-processed plate after the first photosensitive film is removed in S22 according to an embodiment of the present disclosure.

As shown in FIG. 3c, the to-be-treated plate 300 includes a first tab 106, a first copper layer 11, an insulation layer 2, and a second copper layer 12. The first tab 106, the first copper layer 11, the insulation layer 2, and the second copper layer 12 are laminated in sequence and are arranged in close proximity. The first copper layer 11 is arranged with at least one first tab 106 on a side of the first copper layer 11 away from the insulating layer 2.

At block S23: A second photosensitive film is attached to a second predetermined position of the to-be-treated plate, and the to-be-treated plate is etched to form a conductive line on the to-be-treated plate; the second photosensitive film on the to-be-treated plate is removed to obtain the to-be-processed plate after film removal.

Based on a requirement for graphic transfer, the second photosensitive film is attached to the surface of the first copper layer and the second copper layer of the to-be-treated plate. That is, the second photosensitive film is attached to the second predetermined position of the to-be-treated plate, and the to-be-treated plate is graphically etched to form the conductive line on the first copper layer and the second copper layer of the to-be-treated plate to achieve the conductive function of the to-be-treated plate. After the graphic etching is completed, the second photosensitive film is removed from the to-be-treated plate to obtain the to-be-processed plate after film removal.

The second photosensitive film may be a photosensitive anti-etching film, which is a polymeric compound that can be irradiated by a specific light source to produce a polymerization reaction (the process of synthesizing a polymer from a monomer) to form a stable substance adheres to a surface of a plate, thus achieving the function of blocking etching. The second predetermined position is a position on the to-be-treated plate where no conductive lines are to be made.

Figure 3D:
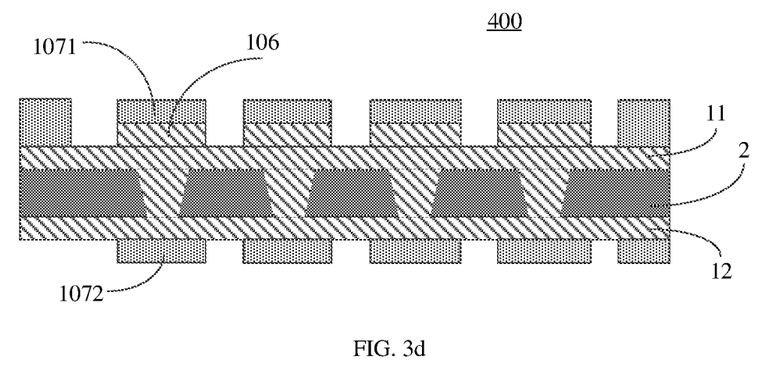
FIG. 3d is a structural schematic view of the to-be-treated plate after being attached with the second photosensitive film in S23 according to an embodiment of the present disclosure.

FIG. 3d is a structural schematic view of the to-be-treated plate after being attached with the second photosensitive film in S23 according to an embodiment of the present disclosure.

As shown in FIG. 3d, the to-be-treated plate 400 includes a second photosensitive film 1071 attached to a surface of a first tab 106, the first tab 106, a first copper layer 11, an insulating layer 2, a second copper layer 12, and a second photosensitive film 1072 attached to a surface of the second copper layer 12. The second photosensitive film 1071 attached to the surface of the first tab 106, the first tab 106, the first copper layer 11, the insulating layer 2, the second copper layer 12, and the second photosensitive film 1072 attached to the surface of the second copper layer 12 are laminated in sequence and are arranged in close proximity. The first copper layer 11 is arranged with a plurality of first tabs 106 on the side of the first copper layer 11 away from the insulation layer 2 and a plurality of second photosensitive films 1071 attached to the surface of the first tabs 106. The second copper layer 12 is arranged with a plurality of second photosensitive films 1072 attached to the surface of the second copper layer 12 on the side of the second copper layer 12 away from the insulation layer 2. Each first tab 106 is attached with a corresponding second photosensitive film 1071 on the surface of the first tab 106 away from the insulating film 2, such that the first tab 106 may be protected. On sides of the first copper layer 11 and the second copper layer 12 away from the insulating layer 2, positions not covered with the second photosensitive films 1071 attached to the surface of the first tabs 106 and the second photosensitive films 1072 attached to the surface of the second copper layer 12 are positions where the conductive line is to be made.

The to-be-treated plate 400 is etched to form the conductive line on the first copper layer 11 and the second copper layer 12. After the etching is completed, the second photosensitive film 1071 attached to the surface of the first tab 106 and the second photosensitive film 1072 attached to the surface of the second copper layer 12 are removed from the to-be-treated plate 400 to obtain the to-be-processed plate after film removal.

Figure 4:
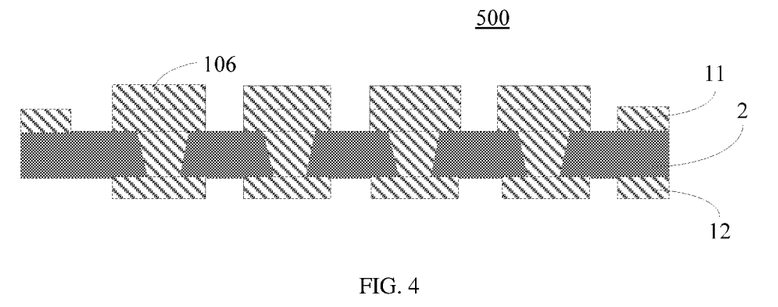
FIG. 4 is a structural schematic view of the to-be-processed plate in S11 obtained in S23 according to an embodiment of the present disclosure.

FIG. 4 is a structural schematic view of the to-be-processed plate in S11 obtained in S23 according to an embodiment of the present disclosure.

As shown in FIG. 4, the to-be-processed plate 500 includes a first tab 106, a first copper layer 11, an insulating layer 2, and a second copper layer 12. The first copper layer 11 and the second copper layer 12 are graphically etched to form the conductive line on the to-be-processed plate 500. Each first tab 106 is unaffected by the graphic etching.

At block S12: A white insulating material is obtained; the white insulating material is laminated to a surface of the insulating layer, a surface of the first copper layer, a surface of the first tab, and a surface of the second copper layer to form a first white insulating medium layer and a second white insulating medium layer on surfaces of the to-be-processed plate.

In the embodiment, the white insulating material is pressed with the surface of the insulating layer, the first copper layer, the first tab, and the second copper layer at high temperature, and the white insulating material is melted and turned into a semi-cured fluid by the press to complete the filling of the various positions on the surface of the to-be-processed plate. Then the first white insulating medium layer and the second white insulating medium layer are formed on the surfaces of the to-be-processed plate.

A surface of the white insulating material is arranged with a release film, which can avoid direct contact between the white insulating material and a high temperature press. The release film is a film that can have a distinction on the surface of the film. The release film is not sticky, or has a slight stickiness after contact with a specific material under limited conditions.

In the embodiment, the white insulating material includes one or more of epoxy resin type, phenolic resin type, polyimide type, BT type, ABF type, and ceramic-based type.

Since white color can reverse most of the light, the first white insulating medium layer and the second white insulating medium layer formed by the white insulating material have very low light absorption, which can improve the reflectivity of the subsequently formed reflective layer.

In the embodiment, titanium dioxide is added to the white insulating material to further enhance the reflectivity of the reflective layer.

In other embodiments, the beige, beige-white or yellowish insulating material can also be pressed at high temperature with the surface of the insulating layer, the first copper layer, the first tab and the second copper layer of the to-be-processed plate to form a beige, beige-white or yellowish insulating medium layer on the surface of the to-be-processed plate, which is not limited herein.

Figure 5:
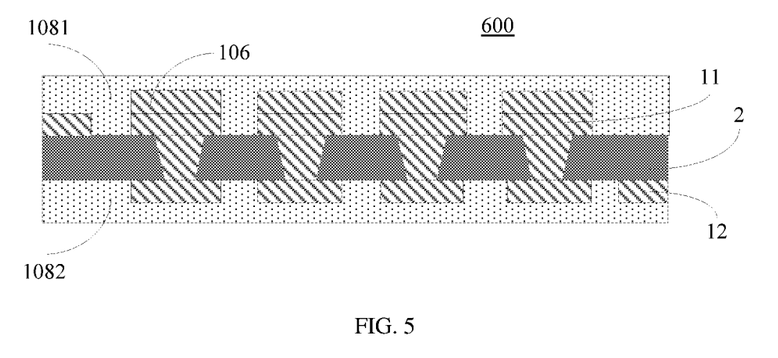
FIG. 5 is a structural schematic view of the to-be-processed plate obtained in S12 according to an embodiment of the present disclosure.

FIG. 5 is a structural schematic view of the to-be-processed plate obtained in S12 according to an embodiment of the present disclosure. As shown in FIG. 5, the to-be-treated plate 600 includes a first white insulating medium layer 1081, a first tab 106, a first copper layer 11, an insulating layer 2, a second copper layer 12, and a second white insulating medium layer 1082.

The first white insulating medium layer 1081, the first tab 106, the first copper layer 11, the insulating layer 2, the second copper layer 12 and the second white insulating medium layer 1082 are laminated in sequence and are arranged in close proximity. A top of the first tab 106 away from the first copper layer 11, a top of the first copper layer 11 away from the insulating layer 2, and the insulating layer 2 not covered by the first copper layer 11 are filled with the first white insulating medium layer 1081. A top of the second copper layer 12 away from the insulating layer 2 and the insulating layer 2 not covered by the second copper layer 12 are filled with the second white insulating medium layer 1082.

At block S13: The first white insulating medium layer is performed with surface polishing and grinded until the first tab is exposed to form a first white reflective layer.

In the embodiment, the first white insulating medium layer is surface polished by one or more of spatulaing, brushing the plate, laser ablation, ion cutting, ion polishing, and waterjetting, and grinded until the first tab is exposed to form the first white reflective layer.

The surface polishing of the first white insulating medium layer can make the surface of the formed first white reflective layer smoother to further reflect light and then further improve the reflectivity.

Figure 6:
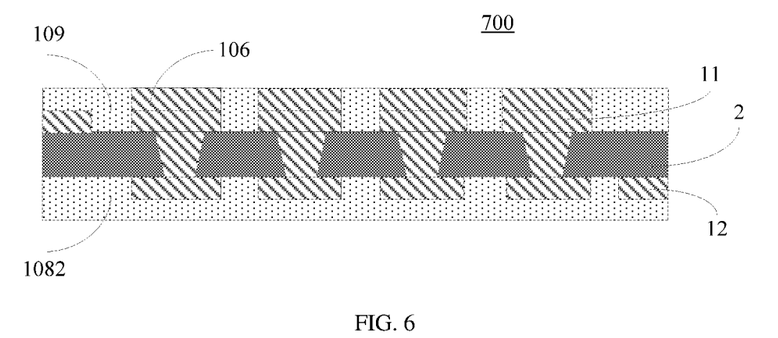
FIG. 6 is a structural schematic view of the to-be-processed plate obtained in S13 according to an embodiment of the present disclosure.

FIG. 6 is a structural schematic view of the to-be-processed plate obtained in S13 according to an embodiment of the present disclosure. As shown in FIG. 6, the to-be-treated plate 700 includes a first white reflective layer 109, a first tab 106, a first copper layer 11, an insulating layer 2, a second copper layer 12, and a second white insulating medium layer 1082.

In the embodiment, the first tab 106 is a welded position and the first white reflective layer 109 covers all of the first surface of the insulating layer 2 except for the welded position.

In a specific implementation scenario, after the surface polishing the first white insulating medium layer 1081 and grinding until the first tab 106 is exposed to form the first white reflective layer 109, the method may also include: etching the first tab 106 to define a groove with a set depth at a set position on the first tab 106; and soldering to a component and/or a chip through the groove with the set depth.

In the embodiment, the first tab 106 is etched using a chemical copper reduction method. The chemical copper reduction method includes micro-etching, chemical cleaning, and surface treatment.

In other embodiments, the first tab 106 may also be etched using a laser ablation method. The laser ablation method includes ablation using UV laser drilling and/or ablation using $CO_2$ laser drilling, and also milling using UV laser, which is not limited herein.

Figure 7:
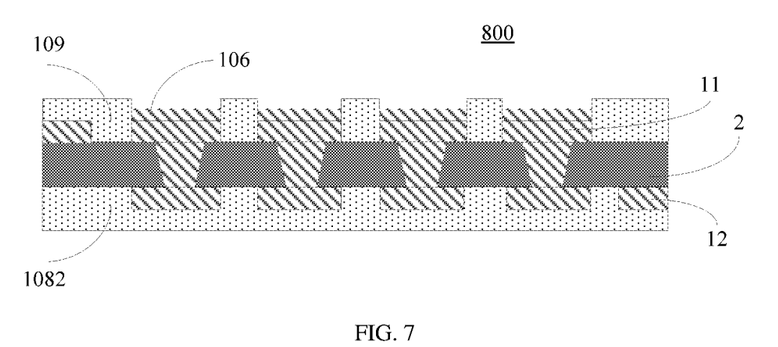
FIG. 7 is a structural schematic view of a to-be-processed plate defining a recess of a set depth according to an embodiment of the present disclosure.

FIG. 7 is a structural schematic view of a to-be-processed plate defining a recess of a set depth according to an embodiment of the present disclosure. As shown in FIG. 7, the to-be-treated plate 800 includes a first white reflective layer 109, a first tab 106 defining a groove with a set depth, a first copper layer 11, an insulating layer 2, a second copper layer 12, and a second white insulating medium layer 1082.

The depth of the recess of the first tab 106 may be controlled according to actual requirements, so as to solder with the components and/or chip in the recess of the set depth.

In contrast to the prior art, the present disclosure forms a white insulating layer by covering the conductor layer with white insulating material and laminating the white insulating material; and then polishes the white insulating layer to form a white reflective layer. The process of forming the reflective layer does not use ink or solder resist dry film, so there is no need to perform a series of steps such as exposure and development, which not only avoids the energy loss caused by the exposure process, but also streamlines the process and improves production efficiency. Further, the lamination and polishing process also prevents the white reflective layer from peeling off and makes the surface of the white reflective layer smoother to further reflect the light, thus providing the backlight with the advantages of high reflectivity and uniformity of reflection, and significantly improving the reflectivity of the printed circuit board surface.

Correspondingly, the present disclosure provides a circuit board, and the circuit board is made by the above-mentioned circuit board preparation method.

Figure 8:
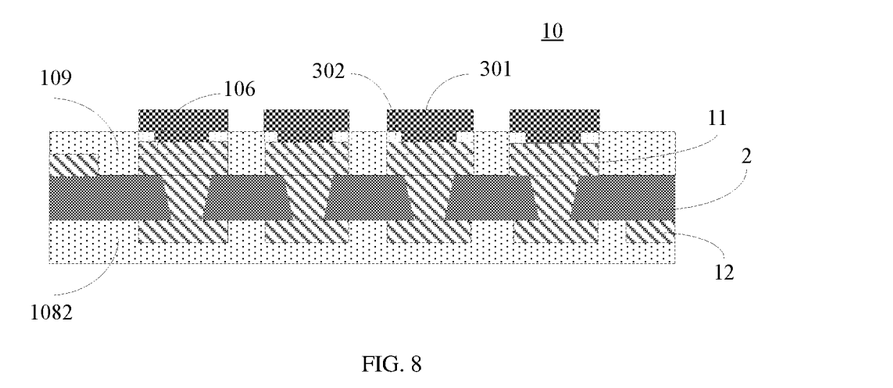
FIG. 8 is a structural schematic view of a circuit board according to an embodiment of the present disclosure.

FIG. 8 is a structural schematic view of a circuit board according to an embodiment of the present disclosure. As shown in FIG. 8, the circuit board 10 includes a welding part 301, a solder 302, a first white reflective layer 109, a first tab 106 defining a recess with a set depth, a first copper layer 11, an insulating layer 2, a second copper layer 12, and a second white insulating dielectric layer 1082.

The welding part 301 includes a component and/or a chip.

In contrast to the prior art, the reflective layer of the circuit board of the present disclosure does not use ink or solder resist dry film, so there is no need for a series of steps such as exposure and development, which not only avoids the energy loss caused by the exposure process, but also streamlines the process and improves production efficiency. Further, because the white reflective layer is pressed together as well as polished, it also bonds more tightly with other plates and has a smoother surface, which can further reflect light, thus giving the backlight source the advantages of high reflectivity and uniformity of reflection, making the reflectivity further improved.

The above is only an implementation of the present disclosure, not to limit the scope of the present disclosure. Any equivalent structure or equivalent process transformation made by using the specification and the attached drawings of the present disclosure, or directly or indirectly applied in other related technical fields, are equally included in the scope of the present disclosure.

What is claimed is:

1. A circuit board preparation method, comprising:
   obtaining a to-be-processed plate; wherein the to-be-processed plate comprises an insulating layer, a first copper layer arranged on a first surface of the insulating layer, a second copper layer arranged on a second surface of the insulating layer and opposite to the first copper layer, a blind metalized hole, and a first tab arranged on the first surface and facing the blind metalized hole;
   obtaining a white insulating material; laminating the white insulating material to a surface of the insulating layer, a surface of the first copper layer, a surface of the first tab, and a surface of the second copper layer to form a first white insulating medium layer on a surface of the to-be-processed plate and a second white insulating medium layer on another surface of the to-be-processed plate opposite to the first while insulating medium layer; and
   performing surface polishing for the first white insulating medium layer and grinding the first white insulating medium layer until the first tab is exposed to form a first white reflective layer.

2. The circuit board preparation method according to claim 1, wherein the white insulating material comprises one or more of: epoxy resin type, phenolic resin type, polyimide type, BT type, ABF type, and ceramic-based type.

3. The circuit board preparation method according to claim 1, wherein the performing surface polishing for the first white insulating medium layer and grinding the first white insulating medium layer until the first tab is exposed to form the first white reflective layer comprise:
   performing surface polishing for the first white insulating medium layer by one or more of: spatulaing, plate brushing, laser ablation, ion cutting, ion polishing, and waterjetting; and grinding the first white insulating medium layer until the first tab is exposed to form the first white reflective layer.

4. The circuit board preparation method according to claim 1, wherein the first tab is a welded position and the first white reflective layer covers all of the first surface of the insulating layer except for the welded position.

5. The circuit board preparation method according to claim 1, after the performing surface polishing for the first white insulating medium layer and grinding the first white insulating medium layer until the first tab is exposed to form the first white reflective layer, further comprising:
   etching the first tab to define a groove with a set depth at a set position on the first tab; and
   soldering to a component and/or a chip through the groove with the set depth.

6. The circuit board preparation method according to claim 5, wherein the etching the first tab to define the groove with the set depth at the set position on the first tab comprises:
   etching the first tab with a chemical copper reduction method; or
   etching the first tab with a laser ablation method.

7. The circuit board preparation method according to claim 6, wherein the chemical copper reduction method comprises micro-etching.

8. The circuit board preparation method according to claim 6, wherein the laser ablation method comprises ablation using UV laser drilling and/or ablation using $CO_2$ laser drilling.

9. The circuit board preparation method according to claim 1, before the obtaining the to-be-processed plate, further comprising:
   obtaining a copper-clad plate; defining at least one hole at a set position of the copper-clad plate by drilling, wherein each of the at least one hole comprises a micro-blind hole and/or a through hole; and hole-treating the at least one hole to obtain a to-be-treated plate;
   applying a first photosensitive film on a surface of a first copper layer and a surface of a second copper layer of the to-be-treated plate, respectively; leaving a first predetermined position on the first photosensitive film exposed; performing hole-filling plating for the first predetermined position of the to-be-treated plate to form the first tab at the first predetermined position; and removing the first photosensitive film from the to-be-treated plate; and
   attaching a second photosensitive film to a second predetermined position of the to-be-treated plate, and etching the to-be-treated plate to form a conductive line on the to-be-treated plate; removing the second photosensitive film on the to-be-treated plate to obtain the to-be-processed plate.

10. The circuit board preparation method according to claim 9, after defining the at least one hole at the set position of the copper-clad plate by drilling, further comprising:
   decontaminating the at least one hole at the copper-clad plate to remove drilling stains.

11. The circuit board preparation method according to claim 9, wherein the hole-treating the at least one hole to obtain the to-be-treated plate comprises: a copper deposition treatment, a black hole treatment or a black shadow treatment.

12. The circuit board preparation method according to claim 9, wherein the second predetermined position is a position at which a conductive line is not planned to be arranged.

13. The circuit board preparation method according to claim 9, wherein the first photosensitive film is a photosensitive anti-plating film, and the second photosensitive film is a photosensitive anti-etching film.

14. The circuit board preparation method according to claim 1, wherein a surface of the white insulating material is arranged with a release film configured to prevent a direct contact between the white insulating material and a high temperature press.

15. A circuit board preparation method, comprising:
   providing a copper-clad plate, wherein the copper-clad plate comprises an insulating layer, a first copper layer arranged on a first surface of the insulating layer, and a second copper layer arranged on a second surface of the insulating layer and opposite to the first copper layer; defining at least one hole at a set position of the copper-clad plate, wherein each of the at least one hole comprises a micro-blind hole and/or a through hole, and the at least one hole penetrates the insulating layer; and hole-treating the at least one hole;
   applying a first photosensitive film on a surface of the first copper layer and a surface of the second copper layer, respectively; leaving a first predetermined position on the first photosensitive film exposed; performing hole-filling plating for the first predetermined position to form a first tab at the first predetermined position; and removing the first photosensitive film from the copper-clad plate;
   attaching a second photosensitive film to a second predetermined position of the copper-clad plate, and etching the copper-clad plate to form a conductive line on the to-be-treated plate; removing the second photosensitive film on the to-be-treated plate to obtain a to-be-processed plate; wherein the second predetermined position is a position at which a conductive line is not planned to be arranged; wherein the to-be-processed plate comprises an insulating layer, a first copper layer arranged on a first surface of the insulating layer, a second copper layer arranged on a second surface of the insulating layer and opposite to the first copper layer, a blind metalized hole, and a first tab arranged on the first surface and facing the blind metalized hole;
   obtaining a white insulating material; laminating the white insulating material to a surface of the insulating layer, a surface of the first copper layer, a surface of the first tab, and a surface of the second copper layer to form a first white insulating medium layer on a surface of the to-be-processed plate and a second white insulating medium layer on another surface of the to-be-processed plate opposite to the first while insulating medium layer; and
   performing surface polishing for the first white insulating medium layer and grinding the first white insulating medium layer until the first tab is exposed to form a first white reflective layer.

16. The circuit board preparation method according to claim 15, wherein the white insulating material comprises one or more of: epoxy resin type, phenolic resin type, polyimide type, BT type, ABF type, and ceramic-based type.

17. The circuit board preparation method according to claim 15, wherein the performing surface polishing for the first white insulating medium layer and grinding the first white insulating medium layer until the first tab is exposed to form the first white reflective layer comprise:
   performing surface polishing for the first white insulating medium layer by one or more of: spatulating, plate brushing, laser ablation, ion cutting, ion polishing, and waterjetting; and grinding the first white insulating medium layer until the first tab is exposed to form the first white reflective layer.

18. The circuit board preparation method according to claim 15, wherein the first tab is a welded position and the first white reflective layer covers all of the first surface of the insulating layer 2 except for the welded position.

19. The circuit board preparation method according to claim 15, after the performing surface polishing for the first white insulating medium layer and grinding the first white insulating medium layer until the first tab is exposed to form the first white reflective layer, further comprising:
- etching the first tab to define a groove with a set depth at a set position on the first tab; and
- soldering to a component and/or a chip through the groove with the set depth.

20. A circuit board preparation method, comprising:
- obtaining a to-be-processed plate; wherein the to-be-processed plate comprises an insulating layer, a first copper layer arranged on a first surface of the insulating layer, a second copper layer arranged on a second surface of the insulating layer and opposite to the first copper layer, a blind metalized hole, and a first tab arranged on the first surface and facing the blind metalized hole;
- obtaining a white insulating material; laminating the white insulating material to a surface of the insulating layer, a surface of the first copper layer, a surface of the first tab, and a surface of the second copper layer to form a first white insulating medium layer on a surface of the to-be-processed plate and a second white insulating medium layer on another surface of the to-be-processed plate opposite to the first while insulating medium layer;
- performing surface polishing for the first white insulating medium layer and grinding the first white insulating medium layer until the first tab is exposed to form a first white reflective layer;
- etching the first tab to define a groove with a set depth at a set position on the first tab; and
- soldering to a component and/or a chip through the groove with the set depth.

* * * * *